United States Patent
Scherb et al.

(10) Patent No.: US 10,230,501 B2
(45) Date of Patent: Mar. 12, 2019

(54) TECHNIQUE FOR STORING SOFTBITS

(71) Applicant: Telefonaktiebolaget LM Ericsson (publ), Stockholm (SE)

(72) Inventors: Ansgar Scherb, Lauf an der Pegnitz (DE); Harald Bauer, Nuremberg (DE); Michael Herrmann, Nuremberg (DE); Manoj Sukumaran, Nuremberg (DE)

(73) Assignee: TELEFONAKTIEBOLAGET LM ERICSSON (PUBL), Stockholm (SE)

( * ) Notice: Subject to any disclaimer, the term of this patent is extended or adjusted under 35 U.S.C. 154(b) by 0 days.

(21) Appl. No.: 15/117,809

(22) PCT Filed: Feb. 14, 2014

(86) PCT No.: PCT/EP2014/052947
§ 371 (c)(1),
(2) Date: Aug. 10, 2016

(87) PCT Pub. No.: WO2015/120907
PCT Pub. Date: Aug. 20, 2015

(65) Prior Publication Data
US 2017/0222764 A1 Aug. 3, 2017

(51) Int. Cl.
*H04L 1/18* (2006.01)
*G06F 11/10* (2006.01)
(Continued)

(52) U.S. Cl.
CPC ........ *H04L 1/1861* (2013.01); *G06F 11/1004* (2013.01); *H04L 1/1835* (2013.01);
(Continued)

(58) Field of Classification Search
CPC ....... H04L 1/18; H04L 1/1812; H04L 1/1819; H04L 1/1822; H04L 1/1829;
(Continued)

(56) References Cited

U.S. PATENT DOCUMENTS

| 2003/0118031 A1 | 6/2003 | Classon et al. |
| 2009/0154392 A1 | 6/2009 | Park et al. |

(Continued)

FOREIGN PATENT DOCUMENTS

| EP | 2093921 A1 | 8/2009 |
| WO | 2009118595 A2 | 10/2009 |
| WO | 2010069379 A2 | 6/2010 |

OTHER PUBLICATIONS

3rd Generation Partnership Project, "LTE; Evolved Universal Terrestrial Radio Access (E-UTRA); User Equipment (UE) radio access capabilities"; Technical Specification 3GPP TS 36.306 version 11.5.0, Release 11, ETSI TS 136 306 V11.5.0, Jan. 1, 2014, pp. 1-32, ETSI.

(Continued)

*Primary Examiner* — Christian M Dorman
(74) *Attorney, Agent, or Firm* — Coats & Bennett, PLLC

(57) ABSTRACT

A technique for storing softbits of messages received according to a Hybrid Automatic Repeat Request (HARQ) protocol is disclosed. As to a method aspect of the technique, a first storage (102) and a second storage (104) are provided. The first storage and a second storage include a plurality of memory segments (103) allocatable to HARQ processes. A first message related to a first HARQ process is received. The first message is protected by a channel code of the HARQ protocol and represented by softbits. The softbits of the first message are stored in a first segment of the first storage. The first segment is allocated to the first HARQ process. The first storage is accessible by a channel decoding unit (110) for decoding the channel code. If a number of allocated segments in the first storage, the decoding of which has not been yet completed, exceeds a threshold, the allocation for the first HARQ process is changed from the first (Continued)

segment in the first storage to a second segment in the second storage.

21 Claims, 5 Drawing Sheets

(51) Int. Cl.
*H03M 13/00* (2006.01)
*H04L 5/00* (2006.01)

(52) U.S. Cl.
CPC .......... *H04L 1/1845* (2013.01); *H04L 1/1864* (2013.01); *H03M 13/6306* (2013.01); *H04L 1/18* (2013.01); *H04L 1/1812* (2013.01); *H04L 1/1819* (2013.01); *H04L 1/1822* (2013.01); *H04L 1/1829* (2013.01); *H04L 1/1841* (2013.01); *H04L 1/1854* (2013.01); *H04L 5/0055* (2013.01)

(58) Field of Classification Search
CPC ... H04L 1/1835; H04L 1/1841; H04L 1/1845; H04L 1/1854; H04L 1/1861; H04L 1/1864; H04L 5/0055; G06F 11/1004; H03M 13/6306
See application file for complete search history.

(56) References Cited

U.S. PATENT DOCUMENTS

| 2013/0013970 | A1* | 1/2013 | Tao | H04L 1/1835 714/748 |
| 2014/0281843 | A1* | 9/2014 | Lo | G06F 11/08 714/807 |
| 2015/0180616 | A1* | 6/2015 | Lee | H04L 1/1812 370/329 |

OTHER PUBLICATIONS

Bai, D., et al., "LTE-Advanced Modem Design: Challenges and Perspectives", LTE-Advanced and 4G Wireless Communications, IEEE Communications Magazine, Feb. 1, 2012, pp. 178-186, IEEE.

* cited by examiner

TECHNIQUE FOR STORING SOFTBITS

TECHNICAL FIELD

The present disclosure generally relates to a technique for storing softbits. More specifically and without limitation, the disclosure relates to a method and a device for storing softbits for a plurality of Hybrid Automatic Repeat Request (HARQ) processes in a HARQ buffer.

BACKGROUND

Data received over a noisy channel, such as a radio channel between a base station and a mobile device, e.g., according to 3GPP Long Term Evolution (LTE) or LTE Advanced, is partly protected by a Hybrid Automatic Repeat Request (HARQ) protocol. The HARQ protocol combines forward error correction provided by a channel code with error detection provided by a Cyclic Redundancy Check (CRC). A mobile device receiving a transport block decodes the channel code. Depending on channel quality, not all transmission errors can be corrected by the forward error correction, which is detected by the mobile device as a CRC failure. Softbits representing such an incorrectly received transport block are stored in a HARQ buffer and combined with softbits of a later retransmission related to the same HARQ process.

For using the channel efficient, a plurality of HARQ processes is executed in parallel on a Media Access Control (MAC) sublayer of the mobile device in a stop-and-wait mode. While one or more HARQ processes are waiting for the retransmission of an incorrectly received transport block, another HARQ process receives data on the channel. Therefore, the HARQ buffer at the mobile device has to store a large amount of softbits. For fast data access, the HARQ buffer is conventionally implemented in On Chip Memory (OCM). However, the OCM is expensive and consumes chip space.

In order to reduce the usage of OCM, existing implementations overbook the memory HARQ buffer. The document WO 2010/069379 describes such a dynamic HARQ buffer management. The HARQ buffer manager administrates the OCM by assigning memory requests to physical resources at the costs of sacrificing valid HARQ data, if no free physical memory space is available in the OCM.

However, the loss of HARQ data can significantly reduce data rates in at least certain situations, e.g., on higher layers of the protocol stack. For example, the data throughput on a Transport Control Protocol (TCP) link is low under critical channel condition, when an initial Block Error Rate (BLER) is at 0.2 or higher. The conventional dynamic HARQ buffer management overwrites valid HARQ data, i.e., softbits of a transport block, the decoding of which initially failed. This leads to retransmissions of the failed transport block that are also not successfully decoded with high probability due to the lacking HARQ data. After a certain number of failed retransmissions, the HARQ protocol on the MAC sublayer controlling the physical layer stops the retransmissions and the TCP enforces the reduction of the data rate.

SUMMARY

Accordingly, there is a need for a technique that stores HARQ data more efficiently in at least some situations.

According to one aspect, a method of storing softbits of messages received according to a Hybrid Automatic Repeat Request (HARQ) protocol is provided. The method comprises a step of providing a first storage and a second storage, wherein the first storage and a second storage include a plurality of memory segments allocatable to HARQ processes; a step of receiving a first message related to a first HARQ process, wherein the first message is protected by a channel code of the HARQ protocol and represented by softbits; a step of storing the softbits of the first message in a first segment of the first storage, wherein the first segment is allocated to the first HARQ process, and wherein the first storage is accessible by a channel decoding unit for decoding the channel code; and a step of changing the allocation for the first HARQ process from the first segment in the first storage to a second segment in the second storage, if a number of allocated segments in the first storage, the decoding of which has not yet been completed, exceeds a threshold.

The technique can, at least in some situations, reduce memory requirements for the first storage, e.g., compared to a conventional HARQ buffer providing equal transfer rates or decoding performance. The memory segments allocatable to HARQ processes are also referred to as HARQ segments or briefly as segments.

The threshold may define a minimum number of segments that are free, e.g., in both the first storage and the second storage. The free segments may encompass segments that are not allocated to any one of the HARQ processes. The minimum number of free segments may always be available, e.g., for receiving further messages, e.g., without increasing the memory requirements of the first storage. The size of the first storage may be independent of the number of HARQ processes.

The first storage may be different from the second storage. The first storage may be integrated in a System-on-a-Chip, e.g., a baseband chip. The second storage may be located outside of the baseband chip. The first storage may be implemented by On Chip Memory (OCM) and/or the second storage may be implemented by Synchronous Dynamic Random Access Memory (SDRAM) or Flash-EEPROM (flash memory).

The first storage and the second storage may define a HARQ buffer for decoding the channel code. An address space of the HARQ buffer may be split into the first storage and the second storage. The channel code may be a block code or a convolutional code, e.g., a Turbo Code or a Viterbi Code. The decoding unit may have direct access to the first storage. The decoding unit may have no direct access to the second storage. The second storage may be unaccessible or not directly accessible by the decoding unit. E.g., the second storage may be unaccessed by the decoding unit when decoding the channel code. Alternatively or in addition, a data connection between the decoding unit and the first storage may have a higher data rate than a data connection between the decoding unit and the second storage.

Changing the allocation for the first HARQ process from the first storage to the second storage may include at least one of releasing the allocation of the first segment to the first HARQ process and allocating the second segment to the first HARQ process. The allocation of any one of the segments to any one of the HARQ processes may be implemented by means of pointers. Changing the allocation may include at least changing the pointers for the first HARQ process. Additionally, the softbits stored in the first segment may be transferred, e.g., copied, to the second segment.

Changing the allocation to the second storage may not include transferring the stored softbits of the first message from the first segment in the first storage to the second segment in the second storage, if decoding the first message was completed based on the softbits of the first message.

A plurality of HARQ processes may be operated in a stop-and-wait mode. After storing the softbits of the first message and before changing the allocation for the first HARQ process to the second storage, at least one second message related to at least one second HARQ process may be received. For each of the at least one second HARQ process, softbits of the second message may be stored in a segment of the first storage. The segment may be allocated to the corresponding second HARQ process.

The first HARQ process may be reallocated from the second storage back to the first storage. The method may further comprise the step of changing the allocation for the first HARQ process from the second segment in the second storage to a third segment in the first storage. The third segment in the first storage may be identical to the first segment or may be a different segment in the first storage.

Changing the allocation from the second storage to the first storage may include at least one of releasing the allocation of the second segment to the first HARQ process and allocating the third segment to the first HARQ process. Changing the allocation back to the first storage may be limited to a manipulation of the pointers representing the allocation. Changing the allocation to the first storage may not include transferring softbits from the second segment in the second storage to the third segment in the first storage, if the decoding of the first message is completed based on the softbits of the first message.

If the decoding failed using the softbits of the first message in the first segment, the softbits of the first segment may be transferred to the second segment in the course of the allocation from the first storage to the second storage. In addition, the softbits may be retransferred to the third segment in the course of the allocation back to the first storage. For example, changing the allocation to the second storage may include transferring the stored softbits of the first message from the first segment in the first storage to the second segment in the second storage, if decoding the first message failed based on the softbits of the first message. Furthermore, changing the allocation to the first storage may include retransferring the softbits from the second segment in the second storage to the third segment in the first storage, if decoding the first message failed based on the softbits of the first message.

The decoding may be repeated after the retransfer based on a combination of the retransferred softbits of the first message related to the first HARQ process and softbits of a third message related to the first HARQ process. The third message may be a retransmission related to the first HARQ process. The retransmission may be triggered by the first HARQ process sending a negative acknowledgement (NACK) signal, if the decoding of the first message failed.

The retransfer may be completed in a Transmission Time Interval (TTI) prior to the repeated decoding. The retransfer may be completed while the third message related to the first HARQ process is processed upstream to the channel decoding unit.

Changing the allocation for the first HARQ process from the second storage to the first storage may be triggered by receiving Downlink Control Information (DCI) indicative of a downlink grant for the first HARQ process.

State information may be stored for at least each of the HARQ processes to which a segment in the first storage is allocated. State information may also be stored for each of the HARQ processes to which a segment in the second storage is allocated. The state information may be indicative of whether or not the segment allocated to the corresponding HARQ process is locked for decoding, e.g., for decoding in the current TTI and/or the subsequent TTI. Changing the allocation to the second storage may further require that the state information of the corresponding HARQ process indicates that the allocated segment is not locked for decoding. Changing the allocation to the second storage may be based on a search among the segments of the first storage for state information that is indicative of the corresponding segment being not locked for decoding. For example, the allocation for the first HARQ process may be changed, since the search yields that the first segment is not locked.

The state information may be initialized for all HARQ processes by indicating that the allocated segment is not locked for decoding. At least one of storing the softbits related the first HARQ process in the first storage and changing the allocation for the first HARQ process to the first storage may include setting the state information for the HARQ process to indicate that the allocated segment is locked for decoding.

After decoding the first message, the state information for the first HARQ process may be set to indicate that the allocated segment is not locked for decoding. After decoding the first message, a Cyclic Redundancy Check (CRC) of the decoded first message may be performed. The state information for the first HARQ process may be set to indicate that the allocated segment is not locked for decoding independent of a result of the CRC. The result of the CRC may indicate completion or failure of the decoding. The result of the CRC may be stored in the state information of the first HARQ process.

According to another aspect, a computer program product comprising program code portions for performing the steps of any one of the methods described above is provided. The steps may be performed when the computer program product is executed by one or more computing devices. The computer program product may be stored on a computer-readable recording medium. The computer program product may be provided for download to such a medium in a data network, e.g., the Internet.

According to a hardware aspect, a device for storing softbits of messages received according to a Hybrid Automatic Repeat Request (HARQ) protocol is provided. The device includes a first storage and a second storage, wherein the first storage and the second storage include a plurality of memory segments allocatable to HARQ processes; a receiving unit adapted to receive a first message related to a first HARQ process, wherein the first message is protected by a channel code of the HARQ protocol and represented by softbits, and to store the softbits of the first message in a first segment of the first storage, wherein the first segment is allocated to the first HARQ process, and wherein the first storage is accessible by a channel decoding unit for decoding the channel code; and a handling unit adapted to change the allocation for the first HARQ process from the first segment in the first storage to a second segment in the second storage, if a number of allocated segments in the first storage, the decoding of which has not yet been completed, exceeds a threshold.

The device may further include any feature of the method aspect and/or the device may further comprise units adapted to perform one or more steps of the method aspect. E.g., the second storage may be unconnected to the channel decoding unit.

The receiving unit may include a soft demodulator. The device may further comprise the channel decoding unit. The channel decoding unit may be arranged downstream of the soft demodulator unit.

BRIEF DESCRIPTION OF THE DRAWINGS

In the following, the present disclosure is described in more detail with reference to exemplary embodiments illustrated in the drawings, wherein.

DETAILED DESCRIPTION

In the following description, for purposes of explanation and not limitation, specific details are set forth, such as specific device and system configurations and specific methods, steps and functions, in order to provide a thorough understanding of the technique presented herein. It will be appreciated that the technique may be practiced in other embodiments that depart from these specific details. While mobile devices, transmission modes and channels described herein are consistent with 3GPP Long Term Evolution (LTE). The technique is also applicable in telecommunications networks according to the Global System for Mobile Communications (GSM) or the Universal Mobile Telecommunications System (UMTS). The technique is further applicable in data networks using any other Radio Access Technology (RAT), e.g., W-LAN according to IEEE 802.11. The technique can also be implemented in any IP Connectivity Access Network (IP-CAN) using a noisy channel other than a radio channel, e.g., Cable DSL.

Those skilled in the art will further appreciate that the methods, steps and functions described herein may be implemented using individual hardware circuitry, using software functioning in conjunction with a programmed microprocessor or a general purpose computer, using one or more Application Specific Integrated Circuits (ASICs), one or more Digital Signal Processors (DSPs) and/or one or more Field Programmable Gate Arrays (FPGAs). It will also be appreciated that the technique disclosed herein may be embodied in a processor and a memory coupled to the processor, wherein the memory stores one or more programs that perform the methods, steps and functions described herein when executed by the processor.

Figure 1:
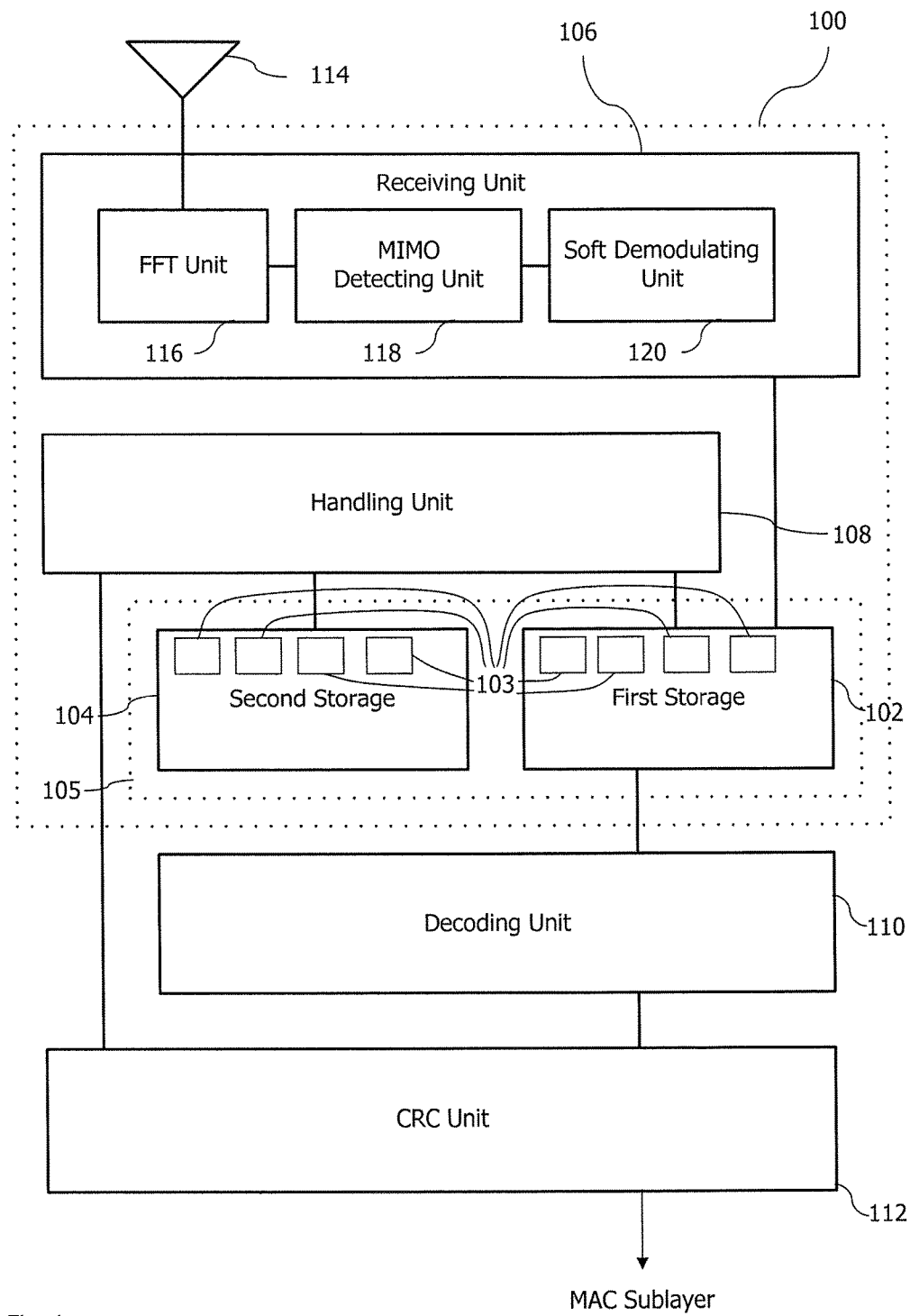
FIG. 1 schematically illustrates a block diagram for a receiver stage including a device for storing softbits.

FIG. 1 schematically illustrates a receiver stage including a device 100 for storing softbits of messages received according to a Hybrid Automatic Repeat Request (HARQ) protocol. The device 100 includes a first storage 102 and a second storage 104 for storing the softbits. Each of the first storage 102 and the second storage 104 includes a plurality of memory segments 103 allocatable to HARQ processes. The first storage 102 and the second storage 104 are collectively referred to as HARQ buffer 105.

The size of each of the HARQ segments 103 corresponds to a cyclic buffer size required for storing the data of one of the HARQ processes. For the clarity of the description, and not for limitation, it is assumed in what follows that one HARQ process is associated to one transport block received by the receiving unit 106. In an exemplary implementation, the number of HARQ segments 103 in the first storage 102 and the second storage 104 is equal to the number of HARQ processes. In an alternative exemplary implementation, e.g., an implementation of transmission modes supporting multiple spatial streams such as two or four layers according to 3GPP, two or more transport blocks are associated to one HARQ process.

The HARQ segments 103 are equally sized. A number of N soft channel bits (e.g., softbits representing the bits transmitted via the channel) are received per transport block. If each softbit is represented by 4 bits, the size of each of the HARQ segments 103 is equal to $(N \cdot 4/8)$ bytes, wherein the division by 8 converts from bit to byte counting.

For an LTE implementation, the total number, N, of soft channel bits is specified in standard document 3GPP TS 36.306 (version 11.5.0) in Sect. 4.1 depending on the category of the mobile device (which is also refer to as User Equipment, UE). To pass the set of minimum performance requirements of 3GPP for category 4 UE devices, a physical soft HARQ buffer size of at least 913,536 bytes per HARQ segment is mandatory. In a worst case scenario, e.g., for Time Division Duplex (TDD) with 15 HARQ processes, the throughput performance is expected to significantly benefit from an even larger soft HARQ buffer size of 1,712,880 bytes per HARQ segment. For category 6 UE devices, the minimum requirement soft HARQ buffer size is 1,827,072 bytes per HARQ segment, whereas an optimal size for TDD with 15 HARQ processes is 3,425,760 bytes.

The device 100 further comprises a receiving unit 106 for receiving messages protected according to the HARQ protocol. The receiving unit 106 is adapted to directly or indirectly (e.g., via decoding unit 110) store softbits of the received messages in the first storage 102.

The device 100 further comprises a handling unit 108 coupled to both the first storage 102 and the second storage 104. Copying softbits from the first storage 102 to the second storage 104, and vice versa, is controlled by the handling unit 108, e.g., by triggering a Direct Memory Access (DMA).

In an exemplary embodiment, the maximum achievable transfer rate between the first storage 102 and the second storage 104 is 228 MByte/s, which corresponds, e.g., to one or more HARQ segments per subframe. The data rate is used by the handling unit 108 for transferring softbits from the first storage 102 to the second storage 104, for retransferring softbits from second storage 104 to the first storage 102, or the transfer rate is split for transferring and retransferring softbits in one subframe.

A decoding unit 110 in the receiver stage of FIG. 1 accesses the first storage 102 for decoding the softbits according to a channel code of the HARQ protocol. Downstream of the decoding unit 110, a Cyclic Redundancy Check (CRC) unit 112 verifies if the message has been correctly decoded. A resulting CRC value is provided by the CRC unit 112 to the handling unit 108. The decoding unit 110 has no access to the second storage 104.

The receiving unit 106 down-converts signals received on one or more antennas 114. The receiving unit 106 includes a Fast Fourier Transformation (FFT) unit 116, a Linear Equalizing Unit or a Multiple Input Multiple Output Detecting Unit 118 (in the case of multiple receiving antennas 114) and a soft demodulating unit 120 for processing the received signals.

The receiver stage and/or the device 100 can be implemented in a mobile device of a telecommunications network.

Figure 2:
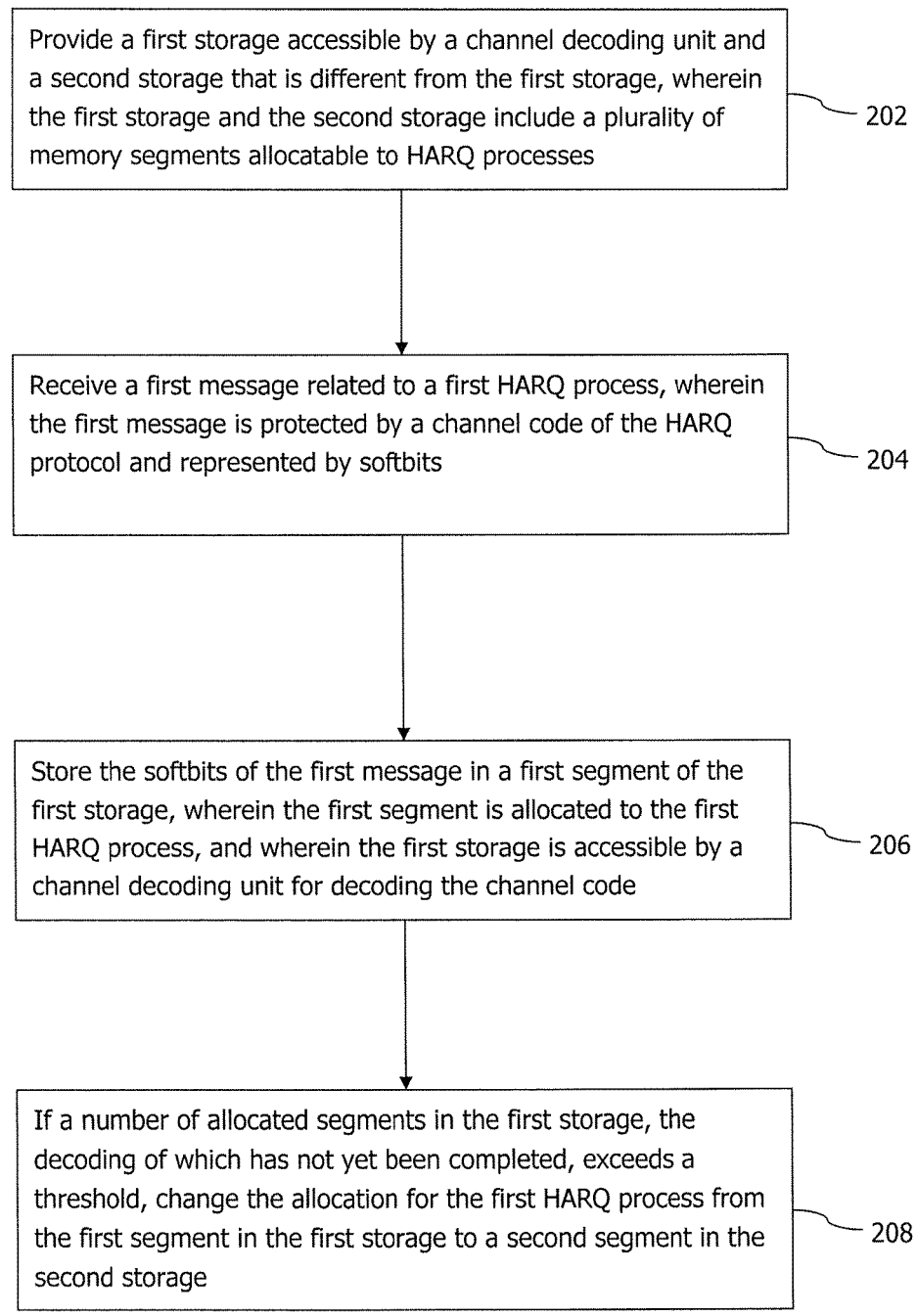
FIG. 2 shows a flowchart for a method of storing softbits performed by the device of FIG. 1.

FIG. 2 shows a flowchart of a method 200 of storing softbits of messages received according to a Hybrid Automatic Repeat Request (HARQ) protocol. The method 200 can be implemented in the mobile device. E.g., the device 100 or the handling 108 performs the method 200.

In a step 202 of the method 200, a first storage and a second storage are provided. The first storage and the second storage include a plurality of memory segments allocatable to HARQ processes. A first message related to a first HARQ process is received in a step 204. The first message is protected by a channel code of the HARQ protocol and represented by softbits. In a step 206, the softbits of the received first message are stored in a first segment of the first storage. The first storage is accessible by a channel decoding unit for decoding the channel code. If a number of allocated segments in the first storage, the decoding of which has not yet been completed, exceeds a threshold, the allocation for the first HARQ process is changed in a step 208 from the first segment in the first storage to a second segment in the second storage.

The receiving step 204 and the storing step 206 are implemented by the receiving unit 106. Alternatively, the receiving step 204 is performed by the receiving unit 106 and the handling unit 108 performs the storing step 206. The handling unit 108 performs the step 208.

The first storage and the second storage are implemented by the storages 102 and 104, respectively. More specifically, the first storage 102 is implemented using On Chip Memory (OCM), e.g., co-located with a processor implementing the functionality of the handling unit 108. The second storage is implemented by Synchronous Dynamic Random Access Memory (SDRAM). The channel decoding is performed by the decoding unit 110.

Figure 3:
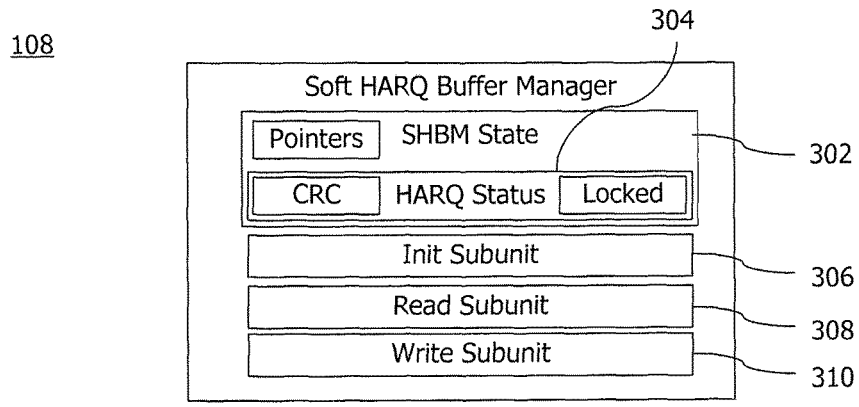
FIG. 3 schematically illustrates a block diagram for a handling unit included in the device of FIG. 1.

FIG. 3 schematically illustrates functional subunits of a Soft HARQ Buffer Manager (SHBM). The functional subunits are used, in part or completely, for an embodiment of the handling unit 108. Since the decoding unit 110 has no direct access to the second storage 104, the SHBM 108 copies softbits, which are currently allocated to the second storage 104 and required by the decoding unit 110 in a subsequent Transmission Time Interval (TTI), from the second storage 104 to the first storage 102 in advance. In an LTE implementation, one TTI is equal to 1 ms.

The SHBM 108 includes memory for an SHBM state 302. The SHBM state 302 includes operating parameters for the SHBM 108, e.g., at least one of the number of HARQ processes, the number of free HARQ segments, the size of the HARQ segments 103 and an identifier of the HARQ process most recently reallocated from the second storage 104 to the first storage 102. The SHBM state 302 further includes pointers to the free HARQ segments 103 in the first storage 102 and the second storage 104.

The SHBM 108 further includes memory for a HARQ status 304. The HARQ status 304 is indicative, for each HARQ process, of whether or not the decoding has been completed. The completion of the decoding is indicated by a positive CRC result of the CRC unit 112. Alternatively or in addition, the HARQ status 304 is indicative, for each HARQ process, of whether or not the HARQ segment 103 allocated to the corresponding HARQ process is currently locked for decoding by the decoding unit 110.

Optionally, the HARQ status 304 is indicative, for each HARQ process, of a location being either the first storage 102 or the second storage 104 of the HARQ segment allocated to the corresponding HARQ process. In a variant of the SHBM 108, the HARQ status 304 is included in the SHBM state 302.

The SHBM 108 comprises an initialization subunit 306 for initializing the SHBM state 302 and/or the HARQ status 304. The SHBM 108 further comprises a read subunit 308 and a write subunit 310. The write subunit 310 performs the step 208 of conditionally changing the allocation of a HARQ segment 103 from the first storage 102 to the second storage 104. The read subunit 308 conditionally changes the allocation back from the second storage 104 to the first storage 102. Furthermore, the read subunit 308 and the write subunit 310 update the SHBM state 302 and/or the HARQ status 304.

The initialization subunit 306 is called once, e.g., when the UE enters a connected mode. The read subunit 308 is triggered by a control signaling event, e.g., when control information received on a control channel has been decoded and parsed so that a reception parameterization of a data channel is known at the UE. The write subunit 110 is called whenever a potential decoding step is finished.

In an advanced embodiment of the SHBM 108, the read subunit 308 and the write subunit 310 are executed multiple times within one TTI. The corresponding multiplicity of executions ensures that the number of free HARQ segments 103 in each of the first storage 102 and the second storage 104 corresponds to the predefined multiplicity.

The HARQ buffer 105 is split between the first storage 102 and the second storage 104. The SHBM 108 manages the allocation of the HARQ segments 103 in the HARQ buffer with respect to physical resources of the first storage 102 and the second storage 104. The SHBM 108 controls physical copy actions (also referred to as transfers) and virtual copy actions (i.e., mere allocation changes) of HARQ segments 103 from the first storage 102 to the second storage 104 using the write subunit 310. The SHBM 108 controls physical copy actions (also referred to as retransfers) and virtual copy actions (i.e., mere allocation changes) of HARQ segments 103 from the second storage 104 to the first storage 102 using the read subunit 308.

In an LTE implementation according to 3GPP TS 36.306, V11.5.0, the SHBM 108 handles up to 4 distinct HARQ segments 103 in parallel, i.e., within one TTI. Furthermore, the SHBM 108 reads and writes HARQ segments 103 in parallel, i.e., within one TTI.

An exemplary implementation of the initialization subunit 306 initializes the values stored in the SHBM state 302 as to the processing mode including the predefined multiplicity, and enabling or disabling a parallel read-and-write capability. The SHBM state 302 includes a mapping of HARQ processes to HARQ segments 103, the location being either in the first storage 102 or in the second storage 104 for each HARQ process, and the HARQ status 304 of each HARQ process. The initialized SHBM state 302 is accessible by each of the subunits 306, 308 and 310.

Figure 4:
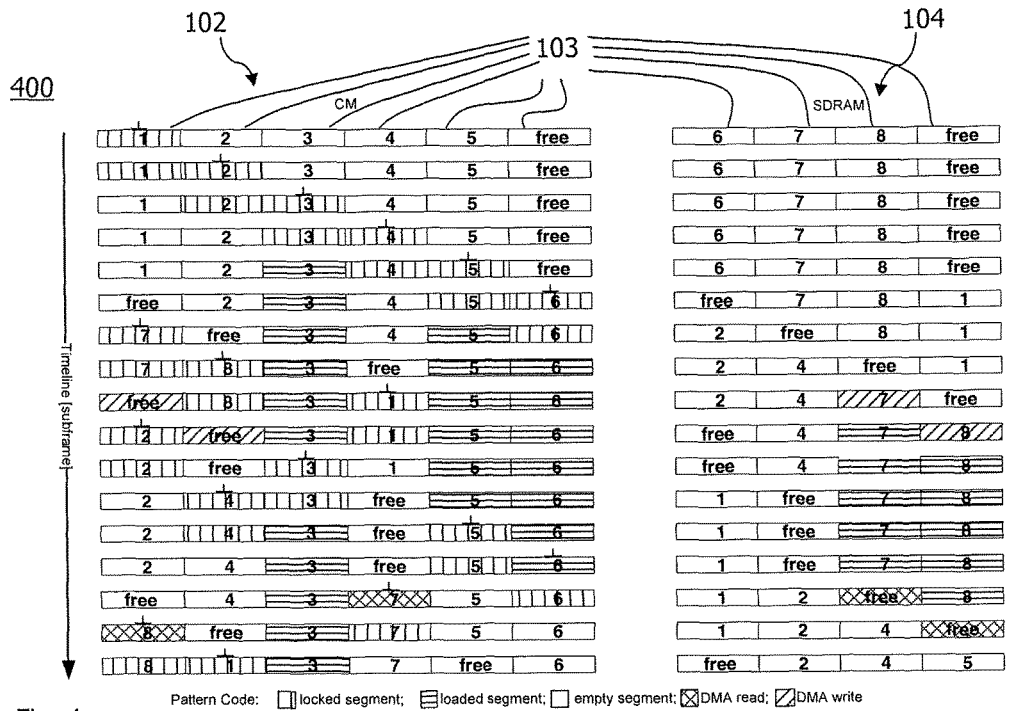
FIG. 4 schematically illustrates an allocation of memory segments of a first storage and a second storage that are included in the device of FIG. 1.

FIG. 4 schematically illustrates the allocation of HARQ segments 103 to HARQ processes as a function of time. Time is shown it units of subframes, i.e., one TTI equal to 1 ms, increasing from top to bottom. One horizontal row corresponds to one subframe. The left-hand side of FIG. 4 illustrates the allocation of HARQ segments 103 in the first storage 102. The right hand-side of FIG. 4 illustrates the allocation of HARQ segments 103 in the second storage 104.

For the clarity of FIG. 4, the technique is illustrated with multiplicity equal to 1. Initially, all HARQ segments 103 of the first storage 102 are associated to the HARQ processes 1 to 5, except for one HARQ segments 103 that is kept free according to the multiplicity. Similarly, all HARQ segments 103 in the second storage 104 are associated to HARQ processes 6 to 8, except for one HARQ segments 103 that is kept free according to the multiplicity.

Storing softbits of a received message into one of the HARQ segments 103 in the first storage 102 according to the step 206 of the method 200 is indicated by an inverse T-symbol above the corresponding HARQ segments 103 in the horizontal row corresponding to the TTI during which the storing is performed. The storing 206 of the softbits in the first storage 102 has to be completed before the decoding unit 110 accesses the HARQ segments 103 including the stored softbits. The storing 206 of the softbits can relate to a recently received message that has not yet been decoded. Alternatively or in addition, the storing 206 of the softbits can relate to a previously received message that has been unsuccessfully decoded. At least in the latter case, the storing 206 is performed by the read subunit 308.

In the first TTI shown in FIG. 4, the first message relates to HARQ process 1. The softbits of the first message are stored in the segment 103 allocated to the HARQ process 1. In the directly subsequent second TTI shown in FIG. 4, the decoding unit 110 reads the softbits received for the HARQ process 1 from the corresponding HARQ segment and the CRC unit 112 provides a positive CRC value to the SI-IBM 108, which indicates the completion of the decoding for the HARQ process 1.

While the decoding unit 110 decodes the first message, the step 206 is performed in relation to the HARQ process 2 by storing a second message received for the HARQ process 2. Similarly, softbits for each of the HARQ processes 1 to 5 are stored according to the step 206 of the method 200 in each case in the first storage 102 in one of the first five TTIs.

The decoding of the HARQ processes 1, 2, 4 and 5 is completed based on the softbits received according to the step 204 in the first transmission of the corresponding message. The decoding of the HARQ process 3 is not completed after the fourth TTI shown in FIG. 4. Rather, the CRC unit 112 indicates to the SHBM 108 that the decoding has failed for the HARQ process 3. Consequently, HARQ process 3 is stopped and waits for a retransmission of the message. The softbits of the retransmitted message for the HARQ process 3 are stored according to the step 206 in the eleventh TTI shown in FIG. 4. Consequently, the softbits for the HARQ process 3 have to be maintained from the third TTI to the eleventh TTI for combining the stored softbits with softbits of the retransmission. In contrast, the softbits stored in the HARQ segments allocated to the HARQ processes 1, 2, 4 and 5 can be overwritten after completion of the decoding in the TTI 2, 3, 5 and 6, respectively.

In the sixth TTI, the softbits of a message received for the HARQ process 6 are to be stored in the first storage 102 according to the step 206. The HARQ segment 103 allocated to the HARQ process 6 is in the second storage 104 prior to the sixth TTI. The positive CRC value for the HARQ process 6 indicates that the decoding of a previously received message for the HARQ process 6 has been completed, i.e., the softbits in the HARQ segment 103 allocated to the HARQ process 6 on the second storage 104 prior to the sixth TTI are not required for a later decoding. Consequently, a virtual copy action from the second storage 104 to the first storage 102 without copying the values of the softbits is performed in the sixth TTI by the read subunit 308. The HARQ segment 103 previously indicated as free in the first storage 102 is allocated to the HARQ process 6 and the softbits of the message currently received for the HARQ process 6 are stored in the allocated HARQ segment 103.

In order to maintain the number of free HARQ segments 103 on the first storage 102 according to the multiplicity, a virtual transfer of the first HARQ segment 103 previously allocated to the HARQ process 1 is performed by the write subunit 310 in the sixth TTI. This is an example of reading and writing simultaneously (i.e., within one TTI).

Upon reception of a first message related to the HARQ process 7 according to the step 204, the softbits for the HARQ process 7 are stored in the previously free HARQ segment 103 in the first storage 102 according to the step 206 and a virtual copy action of the HARQ segment 103 associated to the HARQ process 2 from the first storage 102 to the second storage 104 is performed according to the step 208 in the seventh TTI.

The decoding of the softbits associated to the HARQ process 7 fails in the eighth TTI. Therefore, a transfer of the softbits in the HARQ segments 103 allocated to the HARQ process 7 is performed in the ninth TTI in order to maintain a free HARQ segments 103 after storing softbits of a second message related to the HARQ process 1 in the previously free HARQ segments 103 in the ninth TTI.

Similarly, storing softbits of a first message related to the HARQ process 2 in the tenth TTI according to the step 206 requires freeing a further HARQ segment in the first storage 102 by transferring according to the step 208 the softbits stored in the HARQ segment 103 previously allocated to the HARQ process 8 from the first storage 102 to the second storage 104 in the tenth TTI.

The softbits transferred for the HARQ process 7 from the first storage 102 to the second storage 104 are retransferred in the fifteenth TTI from the second storage 104 to the first storage 102. The decoding unit 110 accesses the HARQ segment 103 allocated to the HARQ process 7 in the sixteenth TTI.

Simultaneously, the softbits of the message related to the HARQ process 8 stored in the second storage 104 are retransferred by the read subunit 308 in the sixteenth TTI.

In an advanced implementation of the technique, a minimum number of three HARQ segments 103 in the first storage 102 is allocated to each of the currently active HARQ processes: one segment to write softbits to, one segment to read softbits from and one segment locked for decoding within the same TTI.

All currently inactive HARQ processes have their allocated HARQ segments 103 in the second storage 104. The total memory requirement necessary for the technique is slightly greater than the sum of the sizes of the first storage 102 and the second storage 104, since additional temporary HARQ segments are necessary for transferring and/or retransferring HARQ segments in parallel. Furthermore, the available memory on the second storage 104 can be considered as variable (e.g., with a size limit that is significantly larger than required for the optimal HARQ buffer size).

The technique presented herein can further be combined with the dynamic HARQ buffer manager according to WO 2010/069379. For example, the HARQ buffer, i.e., the combination of the first storage 102 and the second storage 104, is smaller than required for storing one HARQ segment for each of the HARQ processes (or smaller than required for storing two HARQ segments for each of the HARQ processes in the case of a dual carrier supporting two layers). Under bad channel condition, the undersized HARQ buffer requires overwriting softbits, even if the corresponding CRC value was negative (i.e., the softbits would be used for improving a later decoding step). By way of example, for TDD with 15 HARQ processes, such a performance degradation due to overwriting valid softbits (also referred to as HARQ buffer overbooking) is in accordance with 3GPP requirements.

The transfer and retransfer of softbits is performed using the DMA. Therefore, the transfer and retransfer is also referred to as a DMA data transfer. The DMA data transfer from the first storage 102 to the second storage 104 is only executed, if the number of unallocated HARQ segments 103 in the first storage 102 falls below the multiplicity, so that after the DMA data transfer the number of free (i.e., unallocated) HARQ segments is equal to the multiplicity. The DMA data transfer from the second storage 104 to the first storage 102 is only executed, if the decoding is scheduled based on a retransmission.

Figure 5:
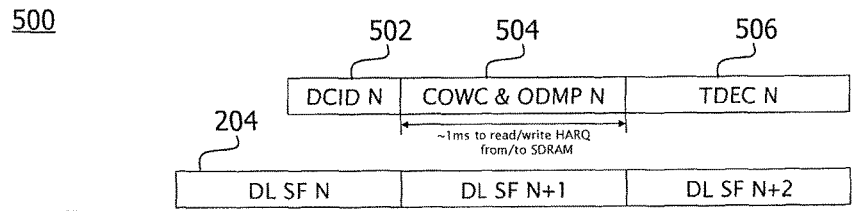
FIG. 5 schematically illustrates a trigger for the handling unit of FIG. 1.

FIG. 5 illustrates a time dependency 500 between reception on a Physical Downlink Shared Channel (PDSCH) and a Physical Downlink Control Channel (PDCCH). The PDCCH provides a trigger for the read subunit 308 conditionally performing the retransfer of softbits or the virtual read action. Time is indicated in the lower horizontal row in units of subframes ("SF") or TTIs during which one transport block is received on the PDCCH as the message according to the step 204. Downlink Control Information (DCI) is received for the transport block N at reference sign 502 on the PDCCH in the same TTI during which the transport block N is received on the PDSCH according to the step 204.

FIG. 5 further illustrates the subsequent processing of the DCI and the transport block N at reference sign 504. The DCI for the transport block N is processed in the directly subsequent TTI including a step of parsing 504 of the DCI. The parsing 504 extracts a HARQ process identifier from the DCI. Based on the HARQ process identifier, the transport block N is related to one of the HARQ processes. The transport block N is decoded in a step 506 in the TTI N+2. For an uninterrupted decoding flow, the handling of the HARQ buffer 105 by the SHBM 108 is performed in the TTI N+1. If the HARQ segment 103, which is allocated to the HARQ process according to the received HARQ process identifier, is not in the first storage 102, the read subunit 308 is triggered for changing the allocation from the second storage 104 to the first storage 102 prior to the decoding 506.

The read subunit 308 is called immediately when a PDSCH downlink grant is signaled to the UE, e.g., when the parsing 504 of the DCI includes the HARQ process identifier. The HARQ process identifier is a parameter of the read subunit 308. The read subunit 308 analyses the HARQ status 304 indicating the location of the corresponding HARQ segment being either in the first storage 102 or the second storage 104. The read subunit 308 ensures that the HARQ segment 103 allocated to the HARQ process indicated in the DCI 502 is available on the first storage 102 before the decoding 506 is started. If the HARQ status 304 indicates that the corresponding HARQ segment 103 is in the second storage 104 and the CRC is negative, the read subunit 308 triggers the retransfer of the softbits from second storage 104 to the first storage 102.

Furthermore, the read subunit 308 updates the SHBM state 302 according to the changed allocation.

The read subunit 308 selectively performs either no read action (optionally returned by a parameter ActionIndex=0), a physical read action (optionally returned by the parameter ActionIndex=1) or a virtual read action (optionally returned by the parameter ActionIndex=2).

If the HARQ segment 103 allocated to the given HARQ process identifier is already mapped onto the first storage 102, no read action is required.

If the HARQ segment 103 allocated to the given HARQ process identifier is mapped to the second storage 104 and if the previous decoding has been completed (i.e., no relevant softbits are stored in the corresponding HARQ segment 103 in the second storage 104), a virtual read action is executed. I.e., the assignment of HARQ process identifier and HARQ segment 103 is changed by changing the allocation of the HARQ segment 103 from the second storage 104 to the first storage 102. No DMA transfer is triggered by the read subunit 308.

If the HARQ segment 103 allocated to the given HARQ process identifier is mapped to the second storage 104 and if the CRC value indicates that the previous decoding was not successfully completed (i.e., relevant softbits are stored in the allocated HARQ segment 103 in the second storage 104), a DMA transfer is triggered for retransferring the softbits from the second storage 104 to the first storage 102.

The write subunit 310 is triggered after the decoding unit 110 has finished independent of whether or not the decoding has been successfully completed. The write subunit 310 is called at least m times per subframe. The multiplicity m is an operating parameter stored in the SHBM state 302. The write subunit 310 performs a clean-up after the read action. The read action includes the physical read action (i.e., the retransfer) or the virtual read action (i.e., mere reallocation).

The clean-up includes changing the allocation for the HARQ process, which was subject of the previous read action, from the first storage 102 to the second storage 104. The clean-up changes the allocation from the first storage 102 to the second storage 104 according to the step 206, whenever a read action of the read subunit 308 has previously changed the allocation from the second storage 104 to the first storage 102 for decoding 506. If no read action had previously been performed for the given HARQ process and/or if the number m of unallocated HARQ segment 103 on the first storage HARQ process 102 is fulfilled, no clean-up is performed. Thus, after calling the write subunit 310, which conditionally triggers the DMA write operation, m free HARQ segments 103 are available on the first storage 102.

Furthermore, the write subunit 310 updates the SHBM state 302 according to the changed allocations in the first storage 102 and the second storage 104.

Figure 6:
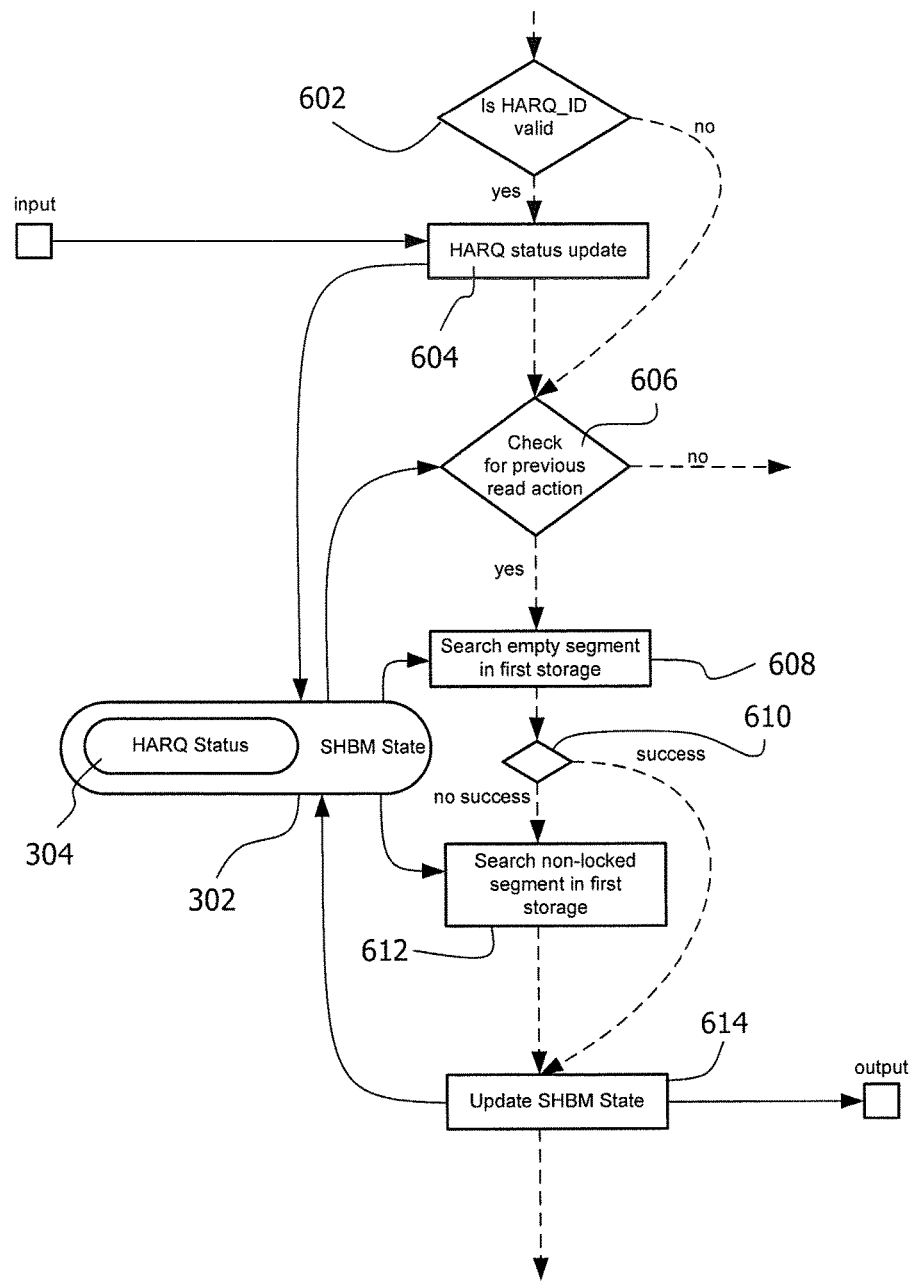
FIG. 6 shows a flowchart for operating a write subunit included in the handling unit of FIG. 1.

An exemplary implementation of the write subunit 310 is shown in the flowchart 600 in FIG. 6. Dashed arrows indicate control flow and solid line errors indicate data flow.

The operation of the write subunit 310 includes a decision step 602 assessing whether or not the HARQ process identifier included in the DCI 502 is valid. If the received HARQ process identifier is valid, the HARQ status 304 is updated in a step 604. The step 604 includes setting the CRC value for the HARQ process corresponding to the received HARQ process identifier to the CRC value that is input to the write subunit 310 from the CRC unit 112. The step 604 further includes changing the HARQ status 304 from unlocked to locked indicating that the corresponding HARQ segment 103 is locked for the decoding 506.

Independent of the existence of a valid HARQ process identifier, the write subunit 310 continues at step 606. If the SHBM state 302 indicates that a previous read action has been performed, as assessed in the step 606, the write subunit 310 performs the clean-up according to steps 608 to 614. If no previous reaction has been performed, the write subunit 310 terminates by returning a parameter ActionIndex=0. Optionally, the write subunit 310 further returns parameters for a destination HARQ segment in the second storage 104 and for a source HARQ segment in the first storage 102, which are set to a value indicating the irrelevance of source and destination, since no clean-up has been performed.

In the step 608, the write subunit 310 searches for an unused or empty HARQ segment 103 in the first storage 102. The allocated HARQ segment 103 is considered unused, if the corresponding CRC value is positive, i.e., no relevant softbits are stored in the allocated HARQ segment 103. If the search is successful, as assessed in step 610, the parameter ActionIndex=2 is returned, which triggers a virtual write action. The parameter indicating the destination HARQ segment in the second storage 104 and the parameter indicating the source HARQ segment in the first storage 102 include the addresses of the HARQ segments 103 to be swapped according to the step 206. No transfer of softbits is triggered. Optionally, the source and destination is only returned for debugging of the write subunit 310.

If no unused HARQ segment allocated to one of the HARQ processes is found in the step 608, as assessed in the step 610, the write subunit 310 searches for a non-locked HARQ segment 103 in the first storage 102 in step 612. Since no unused HARQ segment 103 in the first storage 102 is available, a transfer of softbits has to be triggered. In order to avoid eliminating HARQ data waiting in the processing queue of the decoding unit 110, the locked status is read from the HARQ status 304 in the step 602. Only segments that are not locked for decoding are allowed to be moved from the first storage 102 to the second storage 104. The write subunit 310 returns the ActionIndex=1 and the parameters indicating the destination HARQ segment on the second storage and the source HARQ segment in the first storage, based on which the DMA performs the transfer according to the step 206.

Independent of whether a virtual write action (according to the success branch of the step 610) or a transfer of softbits (according to the no-success branch of the step 610) is performed, the write subunit 310 updates the SHBM status 302 in a step 614.

Figure 7:
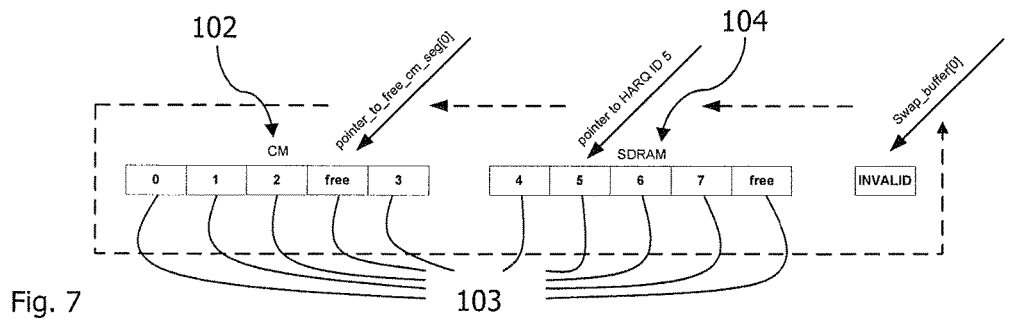
FIG. 7 schematically illustrates changing an allocation from the second storage to the first storage.

The SHBM state 302 includes a map of HARQ segments 103, which indicates those HARQ segments 103 that are allocated to HARQ processes. The SHBM state 302 further indicates free HARQ segments, i.e. those HARQ segments that are unallocated. FIGS. 7 to 10 schematically illustrate the changing of the allocation. Pointers indicate the m free HARQ segments 103 in the first storage 102. The pointers are organized in an array of pointers denoted by "pointer_to_free_cm_seg", wherein the array index is in the range of 0, . . . , m−1. For clarity, FIG. 7 illustrates an example with m=1. A pointer of the form "pointer_to_HARQ ID x" indicates the HARQ segment 103 currently allocated to the HARQ process x. Furthermore, a pointer denoted by "Swap_buffer" is initially set to "invalid" or "void". The pointers are stored in the SHBM state 302. Changing the allocation according to a virtual read action includes changing the pointers as indicated by the dashed arrows in FIG. 7.

Figure 8:
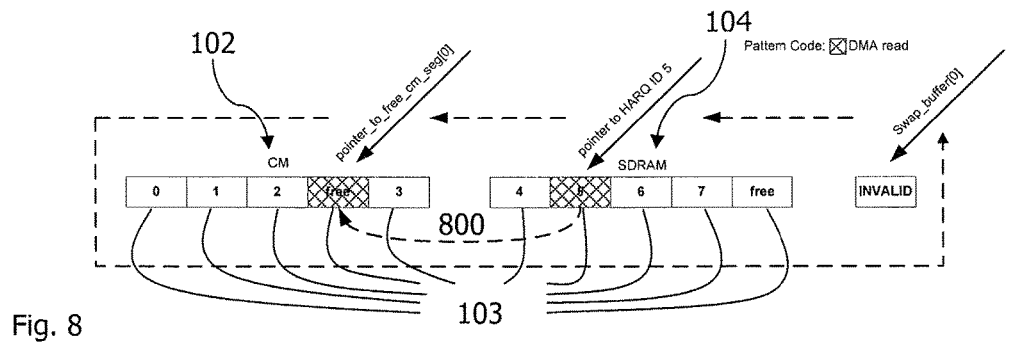
FIG. 8 schematically illustrates a retransfer of softbits from the second storage to the first storage.

FIG. 8 schematically illustrates a physical read action, i.e., a retransfer 800 of softbits from the second storage 104 to the first storage 102. In addition to changing the pointers, as schematically illustrated in FIG. 7, the retransfer includes copying the softbits from the previously allocated HARQ segment 103 in the second storage 104 to the destination HARQ segment 103 to be allocated to the same HARQ process in the first storage 102.

As becomes apparent from the exemplary illustration of a virtual read action in FIG. 7 and a physical read action 800 in FIG. 8, the pointer "Swap_buffer" is invalid, if no read action has been performed, and indicates the source HARQ segment in the second storage 104, if a read action has been performed. The step 606 of the method 600 is based on the pointer "Swap_buffer" being either valid or invalid.

In the case of the physical read action 800, the read subunit 308 returns parameters indicating the address of the source HARQ segment 103 in the second storage 104 and the address of the destination HARQ segment 103 in the first storage 102, based on which the DMA retransfers the softbits. In the case of the virtual read action, the source and destination addresses are optionally returned, e.g., for the purpose of debugging.

Figure 9:
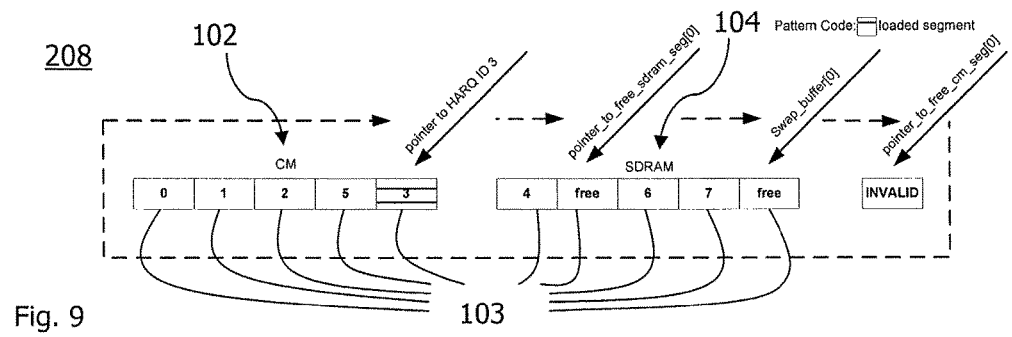
FIG. 9 schematically illustrates changing an allocation from the first storage to the second storage.
Figure 10:
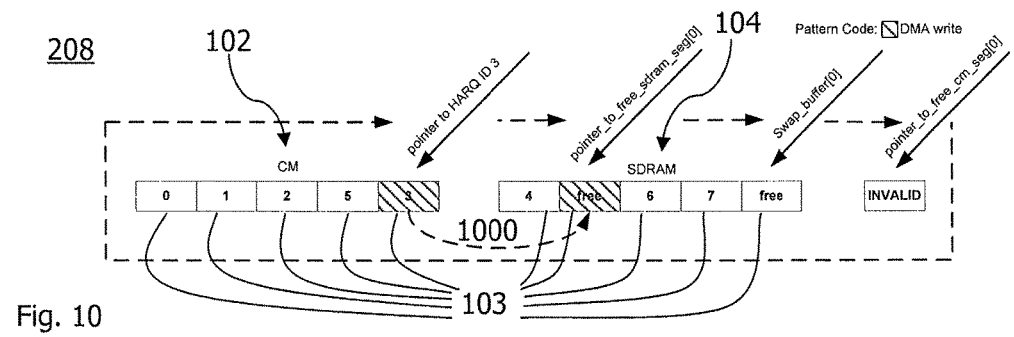
FIG. 10 schematically illustrates a transfer of softbits from the first storage to the second storage.

FIGS. 9 and 10 schematically illustrate an implementation of a virtual write action and a physical write action, respectively, performed by the write subunit 310 according to the step 208. Similar to the read action, a pointer of the form "pointer to HARQ ID x" indicates the HARQ segment 103 currently allocated to the HARQ process of the given HARQ process identifier x. An array of pointers denoted by "pointer_to_free_sdram_seg" indicates the m free HARQ segments 103 in the second storage 104. Changing the allocation according to the step 208 includes changing the pointers according to the dashed arrows.

FIG. 10 schematically illustrates the physical write action, which includes (in addition to the changing of the pointers illustrated in FIG. 9) a step 1000 of transferring the softbits from the previously allocated HARQ segment 103 in the first storage 102 to the newly allocated HARQ segment in the second storage 104.

As has become apparent from above exemplary embodiments, at least some of the embodiments reduce the requirements for an expensive first storage, e.g., On Chip Memory (OCM). Same or other embodiments avoid additional latencies in HARQ data access, e.g., for a continuous channel decoding.

The size of the first storage can be limited and the full HARQ buffer size (e.g., as required by 3GPP or even larger buffer sizes) is available for storing received softbits. Moreover, some of the embodiments minimize data traffic between the first storage and the second storage, e.g., based on a current HARQ status, in order to reduce power consumption.

In the foregoing, principles, exemplary embodiments and various modes of implementing the technique disclosed herein have been described. However, the present invention should not be construed as limited to the particular principles, embodiments and modes discussed above. Rather, it will be appreciated that variations and modifications may be made by a person skilled in the art without departing from the scope of the present invention as defined in the following claims.

The invention claimed is:

1. A method of storing softbits of messages received according to a Hybrid Automatic Repeat Request (HARQ) protocol, the method comprising:
providing a first storage and a second storage, wherein the first storage and the second storage include a plurality of memory segments allocatable to HARQ processes;

receiving a first message related to a first HARQ process, wherein the first message is protected by a channel code of the HARQ protocol and represented by softbits;

storing the softbits of the first message in a first segment of the first storage, wherein the first segment is allocated to the first HARQ process, and wherein the first storage is accessible by a channel decoding unit for decoding the channel code; and if a number of allocated segments in the first storage, where the decoding of messages stored in said allocated segments of the first storage has not yet been completed, exceeds a threshold greater than zero, changing the allocation for the first HARQ process from the first segment in the first storage to a second segment in the second storage, wherein the changing the allocation to the second storage includes transferring the stored softbits of the first message from the first segment in the first storage to the second segment in the second storage, if decoding the first message failed based on the softbits of the first message;

changing the allocation from the second segment in the second storage to a third segment in the first storage, wherein the changing the allocation to the third segment in the first storage includes retransferring the softbits from the second segment in the second storage to the third segment in the first storage, if decoding the first message failed based on the softbits of the first message.

2. The method of claim 1, wherein the changing the allocation to the second storage includes at least one of:
releasing the allocation of the first segment to the first HARQ process; and
allocating the second segment to the first HARQ process.

3. The method of claim 1, wherein the changing the allocation to the second storage does not include transferring the stored softbits of the first message from the first segment in the first storage to the second segment in the second storage, if decoding the first message was completed based on the softbits of the first message.

4. The method of claim 1, further comprising, after the storing the softbits of the first message and before the changing the allocation to the second storage, receiving at least one second message related to at least one second HARQ process.

5. The method of claim 4, further comprising, for each of the at least one second HARQ process, storing softbits of the second message in a segment of the first storage, which is allocated to the corresponding second HARQ process.

6. The method of claim 1, wherein the changing the allocation to the third segment in the first storage includes at least one of:
releasing the allocation of the second segment to the first HARQ process; and
allocating the third segment to the first HARQ process.

7. The method of claim 1, wherein changing the allocation to the first storage does not include transferring softbits from the second segment in the second storage to the third segment in the first storage, if decoding the first message was completed based on the softbits of the first message.

8. The method of claim 1, wherein the decoding is repeated after the retransfer based on a combination of the retransferred softbits of the first message related to the first HARQ process and softbits of a second message related to the first HARQ process.

9. The method of claim 8, wherein the retransfer is completed in a Transmission Time Interval (TTI) prior to the repeated decoding.

10. The method of claim 8, wherein the retransfer is completed while the second message related to the first HARQ process is processed upstream to the channel decoding unit.

11. The method of claim 1, wherein the changing the allocation to the third segment of the first storage is triggered by receiving Downlink Control Information (DCI) indicative of a downlink grant for the first HARQ process.

12. The method of claim 1, wherein state information is stored for at least each of the HARQ processes to which a segment of the plurality of memory segments in the first storage is allocated.

13. The method of claim 12, wherein the changing the allocation to the second storage is further subject to the state information of the first HARQ process being indicative of the first segment being not locked for decoding.

14. The method of claim 12, further comprising searching among the segments of the plurality of memory segments of the first storage for state information indicative of the corresponding segment being not locked for decoding, the search yielding the first segment for changing the allocation to the second storage.

15. The method of claim 12, wherein at least one of storing the softbits related to the first HARQ process in the first storage and changing the allocation for the first HARQ process includes setting the state information for the first HARQ process to indicate that the allocated segment is locked for decoding.

16. The method of claim 12, further comprising, after decoding the first message, setting the state information for the first HARQ process to indicate that the allocated segment is not locked for decoding.

17. The method of claim 12, further comprising, after decoding the first message, performing a Cyclic Redundancy Check (CRC) of the decoded first message, a result of which indicates completion or failure of the decoding and is stored in the state information.

18. The method of claim 1, wherein the second storage is not directly accessible by the channel decoding unit.

19. A computer program product stored in a non-transitory computer readable medium for storing softbits of messages received according to a Hybrid Automatic Repeat Request (HARQ) protocol, the computer program product comprising software instructions which, when run on one or more processing circuits of a computing device, causes the computing device to:
provide a first storage and a second storage, wherein the first storage and the second storage include a plurality of memory segments allocatable to HARQ processes;
receive a first message related to a first HARQ process, wherein the first message is protected by a channel code of the HARQ protocol and represented by softbits;
store the softbits of the first message in a first segment of the first storage, wherein the first segment is allocated to the first HARQ process, and wherein the first storage is accessible by a channel decoding unit for decoding the channel code; and
if a number of allocated segments in the first storage, where the decoding of messages stored in said allocated segments has not yet been completed, exceeds a threshold greater than zero, change the allocation for the first HARQ process from the first segment in the first storage to a second segment in the second storage, wherein the changing the allocation to the second storage includes transferring the stored softbits of the first message from the first segment in the first storage to the second segment in the second storage, if decoding the first message failed based on the softbits of the first message;

changing the allocation from the second segment in the second storage to a third segment in the first storage, wherein the changing the allocation to the third segment in the first storage includes retransferring the softbits from the second segment in the second storage to the third segment in the first storage, if decoding the first message failed based on the softbits of the first message.

20. A device for storing softbits of messages received according to a Hybrid Automatic Repeat Request (HARQ) protocol, the device comprising:

a first storage and a second storage, wherein the first storage and the second storage include a plurality of memory segments allocatable to HARQ processes;

processing circuitry;

memory containing instruction executable by the processing circuitry whereby the processing circuitry is operable to function as:

a receiving unit configured to:

receive a first message related to a first HARQ process, wherein the first message is protected by a channel code of the HARQ protocol and represented by softbits; and store the softbits of the first message in a first segment of the first storage, wherein the first segment is allocated to the first HARQ process, and wherein the first storage is accessible by a channel decoding unit for decoding the channel code; and a handling unit configured to:

change the allocation for the first HARQ process from the first segment in the first storage to a second segment in the second storage, if a number of allocated segments in the first storage, where the decoding of messages stored in said allocated segments has not yet been completed, exceeds a threshold greater than zero, wherein the changing the allocation to the second storage includes transferring the stored softbits of the first message from the first segment in the first storage to the second segment in the second storage, if decoding the first message failed based on the softbits of the first message;

change the allocation from the second segment in the second storage to a third segment in the first storage, wherein the changing the allocation to the third segment in the first storage includes retransferring the softbits from the second segment in the second storage to the third segment in the first storage, if decoding the first message failed based on the softbits of the first message.

21. The device of claim 20:

wherein the receiving unit includes a soft demodulating unit;

the device further comprising the channel decoding unit, the channel decoding unit disposed operatively downstream of the soft demodulating unit;

wherein the second storage is not directly accessible by the channel decoding unit.

\* \* \* \* \*